(12) United States Patent
Fonteneau et al.

(10) Patent No.: US 8,182,290 B2
(45) Date of Patent: May 22, 2012

(54) ELECTRICAL SHIELDING CAGE AND SYSTEM THEREOF

(75) Inventors: Michel Fonteneau, Le Mans (FR); Per Georg Gabrielsson, Hasselby (SE)

(73) Assignee: FCI, Versailles (FR)

( * ) Notice: Subject to any disclaimer, the term of this patent is extended or adjusted under 35 U.S.C. 154(b) by 0 days.

(21) Appl. No.: 12/736,254

(22) PCT Filed: Mar. 26, 2008

(86) PCT No.: PCT/IB2008/002301
§ 371 (c)(1),
(2), (4) Date: Oct. 25, 2010

(87) PCT Pub. No.: WO2009/118581
PCT Pub. Date: Oct. 1, 2009

(65) Prior Publication Data
US 2011/0053415 A1 Mar. 3, 2011

(51) Int. Cl.
*H01R 13/648* (2006.01)
(52) U.S. Cl. ............................. 439/607.21; 439/607.4
(58) Field of Classification Search . 436/607.01–607.59
See application file for complete search history.

(56) References Cited

U.S. PATENT DOCUMENTS

| | | |
|---|---|---|
| 6,443,768 B1 | 9/2002 | Dirkers et al. ................ 439/607 |
| 6,558,191 B2 | 5/2003 | Bright et al. ............... 439/541.5 |
| 6,666,720 B1 | 12/2003 | Reisinger et al. ........ 439/607.13 |
| 6,729,905 B1 | 5/2004 | Hwang ......................... 439/607 |
| 6,731,519 B1 | 5/2004 | Hwang ......................... 361/818 |
| 6,943,287 B2 | 9/2005 | Lloyd et al. ............... 174/35 GC |
| 7,044,777 B1 | 5/2006 | Daly et al. ................. 439/540.1 |
| 7,452,216 B2 | 11/2008 | Murr et al. ...................... 439/74 |
| 2004/0077217 A1 | 4/2004 | Hwang ...................... 439/607.2 |
| 2005/0208831 A1 | 9/2005 | Lee ............................ 439/607.6 |
| 2006/0003632 A1 | 1/2006 | Long .......................... 439/607.2 |
| 2008/0102699 A1* | 5/2008 | Chen ............................ 439/607 |

FOREIGN PATENT DOCUMENTS
WO  WO 2008/121092 A2  10/2008
* cited by examiner

*Primary Examiner* — Phuong Dinh
(74) *Attorney, Agent, or Firm* — Harrington & Smith

(57) ABSTRACT

A shielding cage for receiving a plurality of electronic modules includes a bottom cage portion and a plurality of independent upper cage portions each one of which comprising a top wall and two lateral walls adapted to cooperate with the bottom cage portion. Furthermore, each of said upper cage portions defines with the bottom cage portion a respective compartment having an inner cavity for receiving an electronic module, and a subdivision of said bottom cage portion provides for a bottom wall of said compartment.

18 Claims, 4 Drawing Sheets

ELECTRICAL SHIELDING CAGE AND SYSTEM THEREOF

FIELD OF THE INVENTION

The present invention relates to electrical shielding cages and systems therefor, in particular for electrical and electronic devices in information technology, telecommunication cabinets, servers, or the like.

BACKGROUND OF THE INVENTION

In electronic devices and systems, it is known to use Printed Circuit Boards (PCBs) having a number of electrical and electronic components disposed thereon, to achieve a given function.

Sometimes, there is a need to transfer electronic information between one or more PCBs or devices which are part of a broader system. Electronic or electrical connectors, installed on the PCB, have been found to work well, and provide a convenient interface adaptable for easily connecting and disconnecting devices or PCB together.

In technical domains making use of opto-electronic conversion, such as in information technology, telecommunication cabinets, servers, routers, storage devices, switches, optical or networking devices, the connector is for example of the small form-factor pluggable (SFP) format.

However, such connectors disposed simply on a PCB or the like, suffer from a number of drawbacks. Chiefly among them, and especially in modern systems, electromagnetic radiation due to rapidly changing current emitted either internally, on the PCB, or externally, from the environment, can disturb the effective performance of the interface.

There is therefore a need to protect connectors and the transferred data from disturbance of electromagnetic interference.

It has been shown that electrically conductive shielding cages disposed around such interfacing connectors are effective at reducing electrical interference.

U.S. Pat. No. 6,443,768 or U.S. Pat. No. 6,729,905 already describe such cages and systems.

However, such shielding cages and such connection systems are poorly adapted when assembling multiple connectors on a single printed circuit board, especially in close proximity to each other where they also risk mechanical interference with each other.

Such cages also make non-efficient use of materials. Further, the assembly of the shielding cages has to be easy and quick as possible for the users. This is particularly true in electrical systems such as telecom cabinets, in which these shielding cages are implemented and in which there is usually not much room.

An electrical shielding cage adapted for facilitated assembly and installation of such systems is therefore needed.

A compact electrical shielding cage is also needed.

An alternative solution to present solutions is needed too.

An electrical shielding cage which is cheaper and more efficient on materials is also needed.

SUMMARY OF THE INVENTION

According to the present invention, a shielding cage for receiving a plurality of electronic modules therein is provided, comprising a bottom cage portion made of an electrically conductive material, a plurality of independent upper cage portions made of an electrically conducting material, each of said upper cage portions comprising a top wall and two lateral walls adapted to cooperate with said bottom cage portion, wherein each of said upper cage portions defines with said bottom cage portion a respective compartment having an inner cavity for receiving an electronic module therein, and wherein a subdivision of said bottom cage portion provides for a bottom wall of said compartment.

With these features, manufacturing and assembling a system offering multiple connectors for connection with removable connection modules is simplified, and uses fewer separate parts.

Furthermore, the present system is also less wasteful in manufacturing than previous systems.

Lastly, the robustness of such systems is increased in an efficient manner.

In some embodiments, one might also use one or more of the features defined in the dependent claims.

According to another embodiment, there is provided a shielding cage system further comprising a printed circuit board for mating with the shielding cage.

In yet other embodiments, an electrical connector according to claim 14 and an electrical connector system according to claim 15 are provided.

BRIEF DESCRIPTION OF THE DRAWINGS

Other characteristics and advantages of the invention will appear from the following description of one of its embodiments, provided as a non-limitative example, and of the accompanying drawings.

On the drawings.

On the different figures, the same reference signs designate like or similar elements.

DETAILED DESCRIPTION

Figure 1:
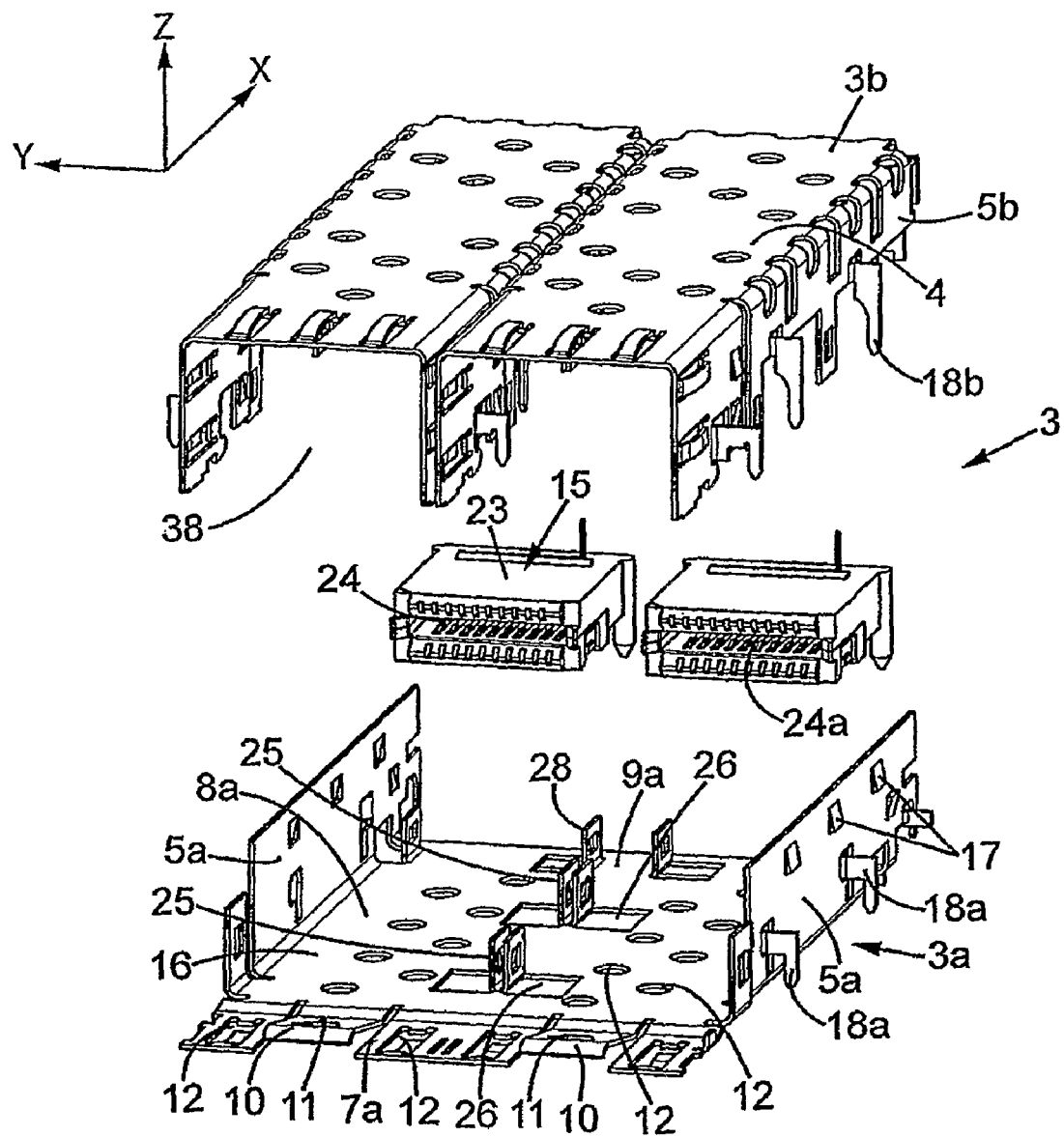
FIG. 1 is a perspective exploded view of an embodiment of a shielding cage.

FIG. 1 shows an exploded view of a shielding cage according to one embodiment of the invention.

The shielding cage comprises an external cage 3 which is made from an electrically conductive material such as for example, a metallic sheet. In the present example, the cage 3 is provided in two parts, a unique lower cage portion 3a and a plurality of U-shaped (or gutter-shaped) upper cage portions 3b, each one of which defining with the lower cage portion 3a a compartment having a cavity 38 for receiving a connector 15, such as an electro-optical module. However, in other embodiments, the cage 3 could be designed differently. Indeed, the upper cage portion 3b may correspond in part or wholly to other known or used designs, provided that it does not include a base wall, having or not openings therein. That is, the upper cage portion should present a substantially U-shaped cross-section.

In the present embodiment (see in particular FIG. 5), the cage 3 is "straddle mounted" through a cut-out in a printed circuit board. In other words, the cage 3 is supported by the edge portion of the cut-out of the printed circuit board. However, other PCB mounts are possible within the scope of the invention, for instance the shielding cage can be mounted on the main surface of a PCB.

Figure 2:
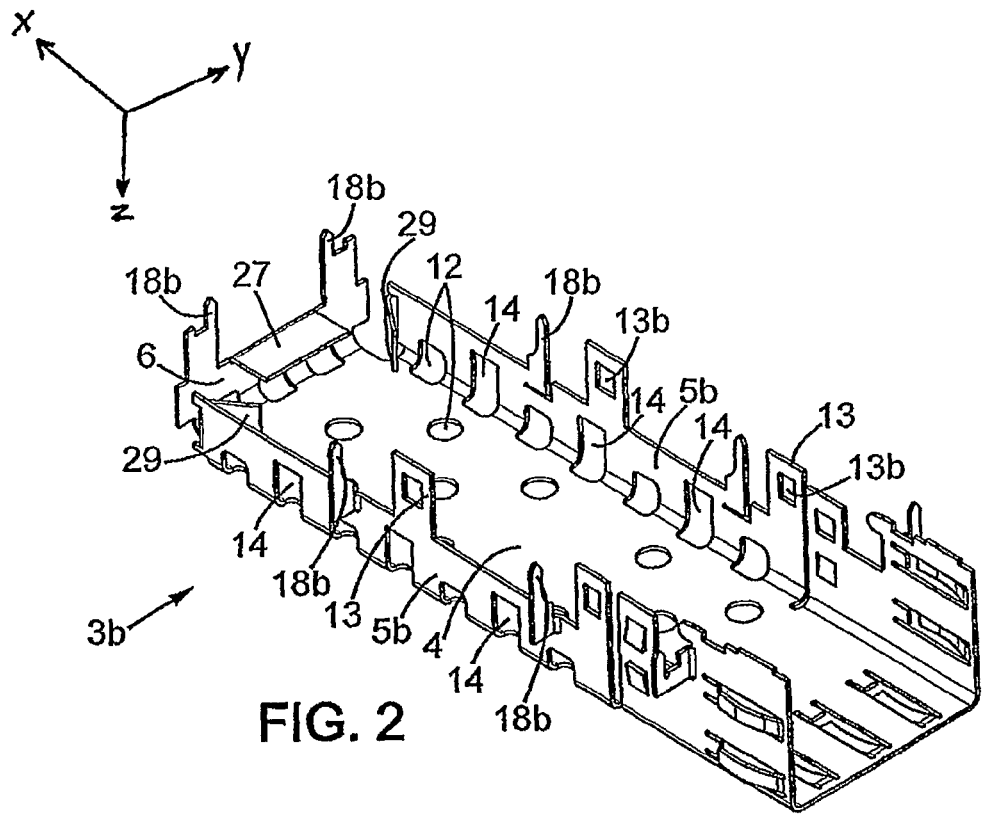
FIG. 2 is a perspective view of the upper shielding cage portion of FIG. 1.

As illustrated in FIG. 2, the upper cage portion 3*b* comprises a top wall 4 extending along a longitudinal axis X, and from which extend two lateral walls 5*b* and a back wall 6. There is no front wall, so as to provide a module opening in the front of the cage 3.

In the present example, the lateral walls 5*b* extend downward to cooperate with the lower cage portion 3*a*.

The top wall 4, the lateral walls 5*b*, and the back wall 6 can further include openings 12, for example obtained by partial cut-outs in the metallic sheet. These openings 12 provide air cooling of the connector, while ensuring appropriate shielding against electro-magnetic interferences. The openings are preferentially disposed along the top wall 4 in three distinct rows to provide optimised electro-magnetic interference shielding while retaining satisfactory heat dissipation.

The lateral walls 5*b* of the upper cage portion 3*b* are further provided with enlarged openings 14 for engaging locking projections or ramp sections 17 provided on the lateral walls 5*a* of the lower shielding cage 3*a*. The ramps 17 may be formed by punching the sheet metal forming the respective lateral walls 5*a*.

Figure 3:
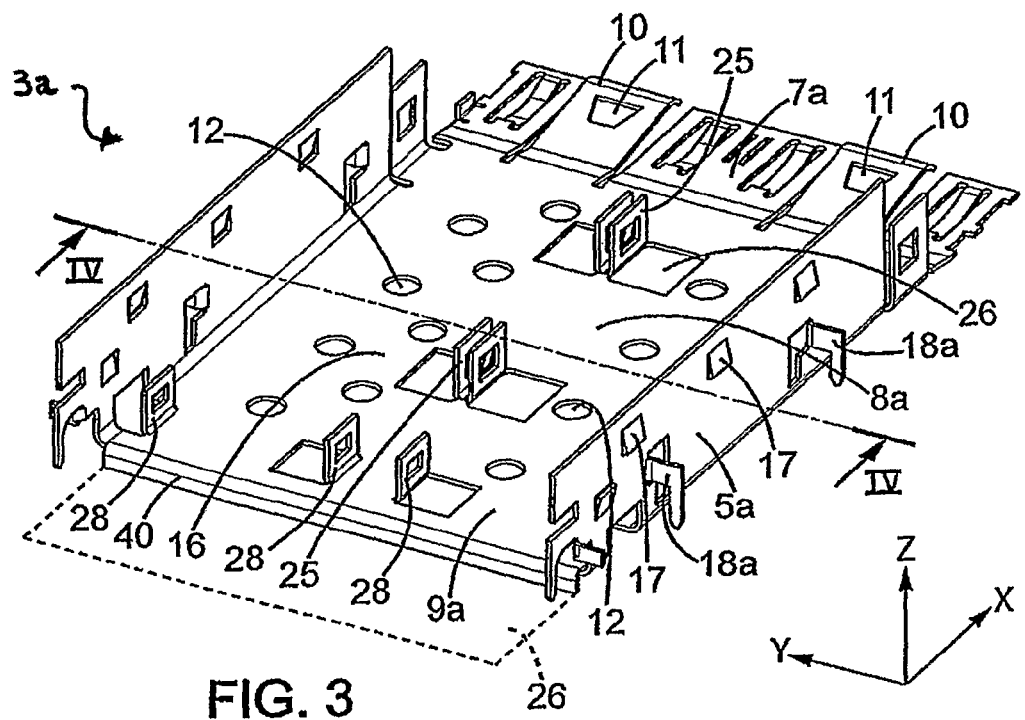
FIG. 3 is a perspective view of the bottom shielding cage portion of FIG. 1.

The lateral walls 5*b* are also provided with tabs 13 extending downwardly towards the lower shielding cage 3*a*, which tabs 13 are provided with a through-hole 13*b* and are designed to lockingly associate with corresponding locking tabs 25 disposed on some bottom wall regions of the lower shielding cage 3*a* (see FIG. 3).

To render manufacturing of upper cage portions 3*b* more efficient, these cage portions 3*b* are provided with substantially mirror features along the longitudinal direction X, including tabs 13 provided on either lateral walls 5*b*. As shown on the present embodiment, a certain number of tabs 13 are not destined to engage with any locking tabs 25, but are present only to simplify the manufacturing process. In particular, the lateral walls 5*a* of the bottom cage portion 3*a* are not provided with locking tabs 25. Instead, retentions posts 18*b* may provide mechanical fixation for the upper cage portions 3*b* on such outside areas. However, it should be understood that it is also possible to provide the lateral wall 5*a* of the bottom cage portion with engaging projections adapted to cooperate with the locking tabs of the lateral wall 5*b* of the upper cage portion 3*b*.

Mechanical retention posts 18*b* on the upper cage portion 3*b* are provided for mechanical fixation to the printed circuit board, in addition to, according to design requirements, electrical connection to the printed circuit board. These retention posts 18*b* may, for example, be soldered into the printed circuit board. In a variant of the present embodiment, retention posts 18*b* may be attached on the printed circuit board using for example known surface-mount techniques. They can also be provided with press-fit terminations. These retention posts 18*b* are for example cut out and bent from the metal sheet, which enables to simultaneously define. Consequently, in the illustrated embodiment, cooling apertures 12 are provided on the back wall 6 and on the lateral walls 5*a*.

The skilled person will understand that some retention posts 18*b* may selectively be folded back and aligned with the lateral walls 5*b*, to prevent mechanical interference between multiple upper cage portions 3*b*, in particular when multiple upper cage portions 3*b* are aligned closely together for assembly, such as shown on the right-hand side of FIG. 2. In general, mechanical retention posts 18*b* will only be provided on external faces of the upper cage portions 3*b*.

Figure 4:
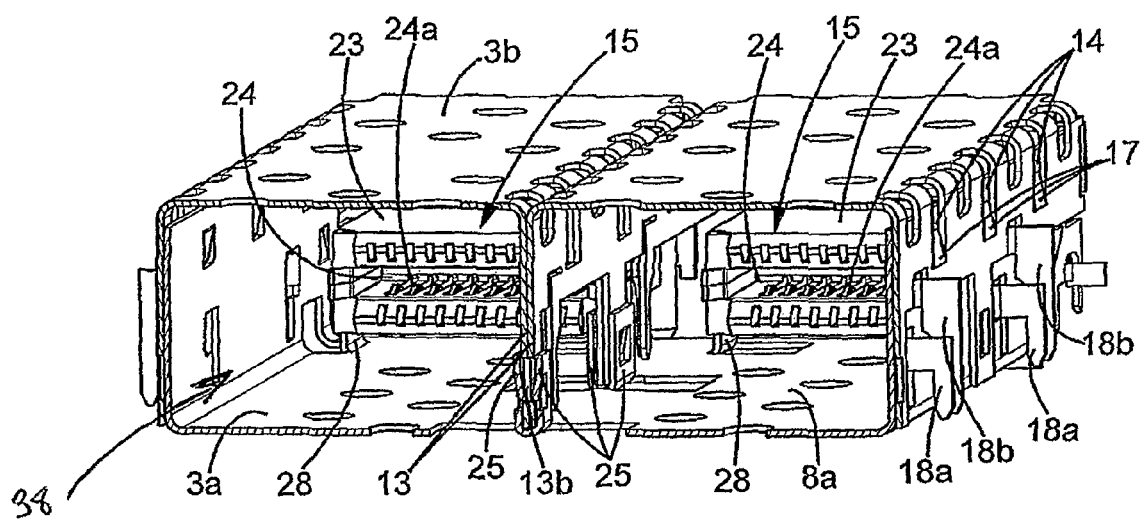
FIG. 4 is a cross-sectional perspective view of the shielding and connector cage in the assembled state.
Figure 5:
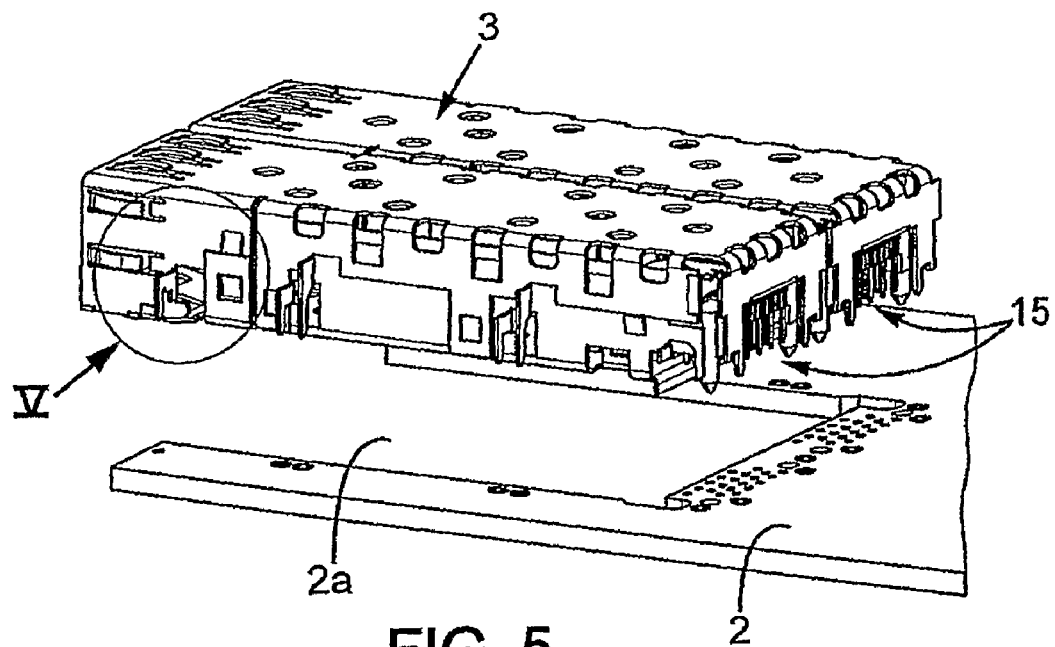
FIG. 5 is a assembled view of the shielding cage of FIG. 1, to be assembled onto a support.

Indeed, in the embodiment illustrated in FIGS. 4 and 5, the cage 3 is straddle-mounted through a cut-out 2*a* provided on the printed circuit board 2. As the cage 3 sits intermediate the top and bottom surface of the printed circuit board, the mechanical retention posts 18*b* are able to penetrate fixation holes provided on the printed circuit board. Nonetheless, the retention posts 18*b* disposed in the interior space of the cage 3, that are not destined to come into contact with the printed circuit board, do not interfere with the bottom wall 16 of the lower cage portion 3*a*.

The herein described mechanical connection of the upper and lower cages is by way of example only, and may be realised many different ways, according to specific instances and design requirements.

The upper cage portion 3*b* further comprises a resilient lip 27 protruding horizontally (parallel to the top wall 5*b*) from the backwall 6, and destined to contact the connector 15 in the assembled state of the cage 3.

Furthermore, two resilient members 29 are provided on the lateral walls 5*b*, between the horizontal lip 27 and the top wall 4. The resilient members may for example take the form of flexible metallic tongues which bias the electro-optical module when inserted in the direction opposite to the longitudinal direction X, to provide for ejection pressure on the inserted opto-electronic module to ease the removal thereof.

As is illustrated in FIG. 3, the lower portion 3*a* of the cage 3 is of similar construction to the upper cage portion 3*b*, but spans, along the Y direction which is perpendicular to the X direction, the width of the plurality of upper cage portions 3*b*. The lower cage portion 3*a* comprises a bottom wall 16 extending parallel to the top wall 4 along the longitudinal direction X, and from which extend two lateral walls 5*a*. The lower cage portion 3*a* comprises a front portion 7*a*, a median portion 8*a* and a rear portion 9*a* along the longitudinal direction X.

On the front portion 7*a*, there are no lateral walls 5*a*, but only the bottom wall 16 which may also be provided with openings 12 such as previously described. At the front portion 7*a*, the bottom wall 16 further comprises a number of latch devices 10 corresponding to the number of upper cage portions 3*b*. The latch device 10 may for example be an elastic tongue naturally biased so as to protrude upwardly from the bottom wall 16, and provided with a locking opening 11 for example of triangular or trapezoidal shape to cooperate with a connector (not shown in FIG. 3) inserted into the cavity 38.

The rear portion 9*a* of the bottom cage portion 3*a* comprises a region 26 with no bottom wall 16, to accommodate an electrical and mechanical connection of the connector 15 to the printed circuit board 2. The edge of the bottom wall 16 at the rear portion 9*a* may be disposed with a reinforcing rib 40 extending in the Y direction, taking the form of a downwardly extending lip.

The external face of the lateral wall 5*a*, in the median and rear portion 8*a*,9*a*, is provided with the ramp sections 17 as previously mentioned, which mechanically cooperate with the openings 14 of the upper cage portion 3*b* of the cage for mechanically locking together the lower and the upper cage portions 3*a*, 3*b*. For example, upon assembly of the cage 3, the upper cage portions 3*b* will be brought in a vertical direction Z towards the lower cage portion 3*a* upon which the lateral walls 5*b* will deflect the locking ramps 17 out of the rest position until these are inserted into the openings 14 in which they can resiliently deform back to their original position in which they prevent an upwardly return movement of the upper cage portion 3*b* with respect to the lower cage portion 3*a*. In this assembled configuration, the tabs 13 of the upper cage portion 3*b* will also enter into mechanical cooperation with the locking tabs 25 of the lower cage portion 3*a* using similar locking dispositions.

FIG. 4 illustrates the assembled state of the upper cage portion 3*b* and the lower cage portion 3*a*, in cross sectional view across the locking tabs 25. This view shows more clearly the locking tabs 25, a portion of which is deflected inside the through-hole 13*b* of the tabs 13.

The assembled state of the cage 3 presents improved lateral bending rigidity due to the parallel walls of two neighbouring upper cage portions.

Turning to FIG. 1 or FIG. 4, a plurality of connectors 15 (electrical connectors and more particularly receptacles in the example), corresponding to the number of module openings 38, are clipped in position between pairs of spaced apart clips 28 positioned in the rear portion 9*a* of the cage 3. In the assembled state, the resilient lip 27 provides continuous downward pressure on connector 15, to minimise vertical movement thereof.

The connector 15 for instance comprises an electrically insulating body 23 which defines a card receiving slot 24 in which electrical terminal members 24*a* extend on one or both sides of the slot 24, for electrical connection to an opto-electrical transceiver module (not shown) to be connected to the connector 15. The connector 15 may be connected to the printed circuit board using any suitable means well know to the man skilled in the art.

As shown in FIG. 5, the shielding cage 3 is mechanically and electrically attached to a printed circuit board (PCB) 2 through the aforementioned retention posts 18*a*, 18*b* in a "straddle-mounted" configuration.

Figure 6:
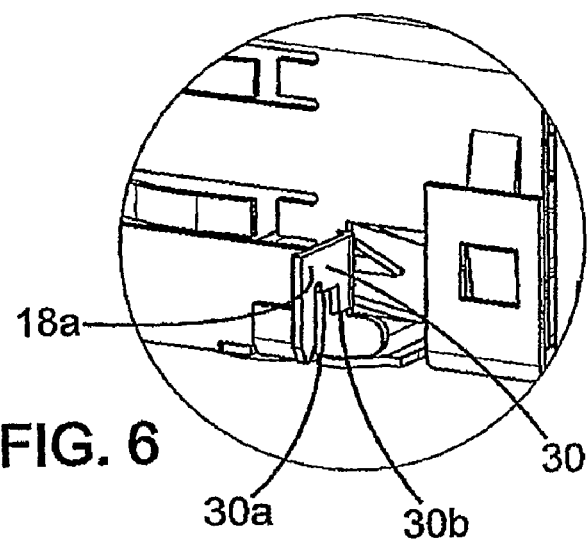
FIG. 6 is a detailed view of FIG. 5.

The cage 3 may however further be fitted, as best illustrated in FIG. 6, with levelling tails 30 to provide a vertical position guide for the straddle of the cage 3 on the PCB. In the present example, the tail 30 is integrated with the retention posts 18*a*. In particular, the tail 30 is cut out of selected retention posts 18*a* to present a step-wise section with multiple horizontal support edges 30*a*, 30*b*. The support edges 30*a*, 30*b*, are designed so that at least one of them come into contact with the main surface of the printed circuit board 2 when the cage 3 is assembled on the printed circuit board 2. The tails 30 provide a vertical height adjustment factor of the cage 3 on the printed circuit board, to permit the cage to sit at different heights on the printed circuit board depending on whether the cage 3 rests on the PCB on the first level edge 30*a* or the second level edge 30*b*. The cut-out area 2*a* on the printed circuit board 2 for receiving the cage 3 is provided larger or narrower around the tails 30 to select which one of the tail edges 30*a*, 30*b* will come into contact with the printed circuit board. Of course, such tails 30 may be integrated into separate independent posts in other embodiments, and may be found on either the upper and/or lower cages 3*b*, 3*a*.

The invention claimed is:

1. A shielding cage for receiving a plurality of electronic modules therein, comprising:
a bottom cage portion made of an electrically conductive material,
a plurality of independent upper cage portions made of an electrically conducting material, each of said upper cage portions comprising a top wall and two lateral walls, each of said upper cage portions being adapted to cooperate with said bottom cage portion,
wherein each of said upper cage portions defines with said bottom cage portion a respective compartment having an inner cavity for accommodating a respective one of said electronic modules directly between a respective one of said upper cage portions and said bottom cage portion in each of said inner cavities, so as to shield each of said electronic modules with a respective single one of the said compartments having a single layer of electrically conducting material, wherein a subdivision of said bottom cage portion provides for a bottom wall of said compartment.

2. A shielding cage according to claim 1, wherein the bottom wall has an aperture disposed for receiving a plurality of electrical receptacles therethrough.

3. A shielding cage according to claim 1, wherein each of the upper cage portions has a U shape cross section.

4. A shielding cage for receiving a plurality of electronic modules therein, comprising:
a bottom cage portion made of an electrically conductive material,
a plurality of independent upper cage portions made of an electrically conducting material, each of said upper cage portions comprising a top wall and two lateral walls, each of said upper cage portions being adapted to cooperate with said bottom cage portion,
wherein each of said upper cage portion's defines with said bottom cage portion a respective compartment having an inner cavity for receiving a single one of said electronic modules therein, wherein a subdivision of said bottom cage portion provides for a bottom wall of said compartment, and wherein said bottom cage portion further comprises a plurality of locking devices adapted for directly contacting at least one of the lateral walls of the upper cage portion for retaining said bottom cage portion with said upper cage portion.

5. A shielding cage according to claim 4, wherein said bottom cage portion further comprises two lateral wall portions each adapted for mating with one lateral wall of an upper cage portions.

6. A shielding cage according to claim 1, wherein said bottom cage portion further comprises at least one outwardly extending guiding feature intended to aid alignment of said shielding cage against an external support, for instance a printed-circuit-board.

7. A shielding cage according to claim 1, wherein said upper cage portion further comprises at least one outwardly extending guiding feature intended to aid alignment of said shielding cage against an external support, for instance a printed-circuit-board.

8. A shielding cage according to claim 6, wherein the guiding feature presents a notch disposed to allow an alternate alignment of said shielding cage against the external support.

9. A shielding cage according to claim 1, wherein at least one of the upper cage portions and/or the bottom cage portions, further presents at least one leg stepping away from said upper cage portion or bottom cage portion respectively, said leg being adapted for making connection with an external support, for instance a printed-circuit-board.

10. A shielding cage according to claim 9, wherein said bottom cage portion further comprises at least one outwardly extending guiding feature intended to aid alignment of said shielding cage against an external support, for instance a printed-circuit board, and wherein the leg comprises the guiding feature.

11. A shielding cage according to claim 1, wherein the bottom wall of the bottom cage portion comprises a reinforcing feature to rigidifying the shielding cage in a direction of alignment of the plurality of the independent upper cage portions.

12. A shielding cage system, comprising:
a shielding cage according to claim 1, a printed-circuit-board (PCB), wherein at least one of either the bottom cage portion or the upper cage portion is connected to said PCB.

13. A shielding cage system according to claim 12, wherein at least one of the upper cage portions and/or the bottom cage portions, further presents at least one leg stepping away from said upper cage portion respectively, said leg being adapted for making connection with an external support, for instance a printed-circuit-board, and wherein the legs are connected to the PCB.

14. An electrical connector comprising:
a shielding cage according to claim 1, wherein each one of the independent upper cage portions defines with the bottom cage an inner cavity for receiving an electronic module therein,
a receptacle inside said cavity, the receptacle comprising:
an electrically insulating body defining a connection region, electrical terminal members in said connection region for making electrical connection with said electronic module, wherein the receptacle at least partially penetrates the aperture of the bottom cage portion.

15. An electrical connector system comprising:
an electrical connector according to claim 14,
a printed-circuit-board (PCB),
wherein the one of either the bottom cage portion or the upper cage portion is connected to said PCB, and wherein the electrical terminal members in the connection region of the receptacle provide an electrical connection between the electronic module and said printed-circuit-board.

16. A shielding cage comprising:
a one-piece bottom cage member made of an electrically conductive material, said bottom cage member comprising a top wall and two lateral walls, and
a plurality of upper cage members made of an electrically conducting material, each of said upper cage members comprising a top wall and two lateral walls, each of said upper cage members being sized and shaped to connect to said bottom cage member to define with said bottom cage member a respective compartment for each upper cage member, said compartments each having an inner cavity for a respective electronic module, and wherein said bottom cage member forms a bottom wall of each of said compartments, where each of said respective electronic modules are directly between said bottom wall of said bottom cage member and said top wall of a respective one of said upper cage members.

17. A shielding cage as in claim 16 wherein said bottom cage member further comprises a plurality of locking devices adapted for directly retaining at least one of the lateral walls of the upper cage member.

18. A shielding cage as in claim 16 wherein said compartments are arranged in a single row.

* * * * *